(12) United States Patent
Hansen et al.

(10) Patent No.: US 6,191,697 B1
(45) Date of Patent: Feb. 20, 2001

(54) CIRCUIT CONTINUITY DETECTION SYSTEM AND METHOD

(75) Inventors: Mark Hansen, Newburgh; Robert Paul Katz, Hopewell Junction, both of NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/294,096

(22) Filed: Apr. 19, 1999

(51) Int. Cl.$^7$ ................................................. G08B 21/00
(52) U.S. Cl. ........................ 340/652; 340/635; 340/640; 340/664
(58) Field of Search ................................ 340/635, 638, 340/652, 660, 661, 640, 664

(56) References Cited

U.S. PATENT DOCUMENTS

| | | | |
|---|---|---|---|
| 3,716,834 | * 2/1973 | Adams | ................................. 340/652 |
| 4,168,491 | 9/1979 | Phillips et al. . | |
| 4,323,914 | 4/1982 | Berndlmaier et al. . | |
| 4,333,119 | 6/1982 | Schoenmeyr . | |
| 4,412,267 | 10/1983 | Hansen . | |
| 4,421,976 | * 12/1983 | Jurek | ................................... 219/506 |
| 4,558,310 | 12/1985 | McAllise . | |
| 4,833,564 | 5/1989 | Pardue et al. . | |
| 5,245,289 | 9/1993 | Rumfield et al. . | |
| 5,424,894 | 6/1995 | Briscall et al. . | |
| 5,488,303 | 1/1996 | Bagalini . | |
| 5,548,523 | 8/1996 | Wehrli, III et al. . | |
| 5,600,524 | 2/1997 | Neiger et al. . | |
| 5,684,443 | 11/1997 | Runyan et al. . | |
| 5,705,989 | * 1/1998 | Cota et al. | ............................ 340/660 |
| 5,715,125 | 2/1998 | Neiger et al. . | |
| 5,959,537 | * 9/1999 | Banting et al. | ....................... 340/664 |

* cited by examiner

*Primary Examiner*—Julie Lieu
(74) *Attorney, Agent, or Firm*—Ira D. Blecker, Esq.; McGinn & Gibb, PLLC

(57) ABSTRACT

In many technical applications, situations often arise where it is desirable to know, in real time, if a circuit is functioning. That is, it is desirable to know if, for example, a heater element is operational or blown (open). By sensing the current flowing to the circuit, it is easy to determine if the circuit is operational. However, this only provides information while the circuit is in the process of operating. There must be some real-time connection with the request or demand for power to know if in fact the device is non-operational, or if there is simply no controller request for power. A system (and method) according to the invention includes a real-time, simultaneous current and voltage sensing and arbitration device which provides a single, point of use implementation, and allows for detection and signaling of a fault condition. A circuit breaker may be constructed to incorporate such a system.

21 Claims, 3 Drawing Sheets

CIRCUIT CONTINUITY DETECTION SYSTEM AND METHOD

BACKGROUND OF THE INVENTION

1. Field of the Invention

The present invention generally relates to a circuit continuity detection system and method, and more specifically, to a circuit continuity detection system and method that senses current and voltage simultaneously at a single point of operation.

2. Description of the Related Art

In many technical applications, situations often arise where it is desirable to know, in real time, if a circuit is functioning. That is, it is desirable to know if, for example, a heater element is operational or "blown" (open). It is relatively simple to determine if the circuit is operational by sensing the current flowing to the circuit.

However, this only provides information while the circuit is in the process of operating. There must be some real-time relation to or connection with the request or demand for power, to determine if the device is in fact not operational, or if there is simply no controller request to provide power. Conventional devices provide no such means to arbitrate the presence of current in a circuit along with the voltage request or demand for power.

Furthermore, indication of a failure condition would require a continual or known interval monitor, or a connection to a controller device for continual monitoring and condition reporting. Even then, some connection with the request for power must be made to enable the proper function to be determined.

Conventional, discrete current sensing loops and voltage sensing coils could be used to derive the required parameters, and with the application of an external arbitration means, one could derive the function described. However, this method is costly, cumbersome and requires externally-powered devices. Further, its distributed nature makes it a formidable challenge to implement.

Therefore, it is necessary to assess and arbitrate the current and voltage demand at a single point to provide ease of integration. The most obvious point to obtain these parameters is at the circuit breaker that governs the operation of the circuit.

FIG. 1A illustrates a conventional circuit breaker 10 for detecting a current overload condition. Circuit power is provided from an external source 15, connected to a contact 19. The breaker includes an ON-OFF activation switch 13 which enables or disables the device's function, a current sensing coil 11, which is attached to a set of normally closed contacts 14a, 14b, and a pivot 12 that allows the actuation of contact 14a into an open state (e.g. away from its mating "closed" contact 14b) upon sensing a current overload condition. This operation "breaks" (e.g., opens) the circuit and protects the load from damage from exposure to a current above the breaker rating.

FIG. 1B illustrates a standard implementation of the circuit breaker of FIG. 1A. A voltage source 15 is connected to a voltage controller 16, which sends power to the circuit. The power is routed to one or more loads through separate circuit breakers (e.g., CB1—10a, CB2—10b). The load 18a, 18b is connected in series to its respective circuit breaker 10a, 10b.

The device of FIG. 1A, as implemented in FIG. 1B, provides the ability to open or "trip" within the series circuit to which it is installed. It has no ability to arbitrate request or demand for circuit activation, and it provides no means for external communication about its state or condition, nor about the state or condition of the circuit in which it is installed, nor about the state or condition of the load attached (e.g., 18a, 18b).

SUMMARY OF THE INVENTION

In view of the foregoing problems of the conventional circuit breaker, an object of the present invention is to provide a structure and method for determining the state of the load of a circuit (e.g., for determining whether the load of a circuit is functional or nonfunctional (open load).

In a first aspect of the present invention, a circuit continuity detection system coupled to a voltage source and load includes a current sensor for sensing current through a circuit, a voltage sensor for sensing the presence of voltage from the source to be delivered across the load, and an arbitration device (and method) to simultaneously arbitrate signals from the current sensor and the voltage sensor to determine an operable status of the load.

In a second aspect of the present invention, a circuit breaker coupled between a voltage source and a load includes the above described circuit continuity detection system.

In a third aspect of the present invention, a method of detecting continuity of a circuit coupled to a voltage source and a load, includes sensing a current drawn through a circuit to produce a first output, sensing a voltage applied from the source across the load, simultaneously with sensing of the current, to produce a second output, and arbitrating the first and second outputs to determine an operable status of the load.

With the unique and unobvious features of the present invention, an open load condition can be detected via the detection of simultaneous applied voltage and the absence of circuit current.

Further, the structure of the invention can be implemented as a discrete device in a host of applications and need not be implemented as part of a circuit breaker.

With the invention, and taking the circuit breaker as an exemplary application, the load is connected to the breaker, and the detector can determine the load circuit's operational status. In the case of a circuit connected as a load to the device, when an open load condition exists, the device detects and reacts to the open load condition. The invention can detect a resistive load circuit's failure (open load condition) in real time, and can utilize a majority of existing hardware to minimize implementation costs and effort.

Furthermore, existing industrial applications can be upgraded to the device described by the invention within the same physical space ("footprint"), and without mechanical modifications. Thus, existing systems can be easily retrofitted with the inventive system.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

Referring to FIGS. 2A, 2B, 2C, and 3, preferred embodiments of the present invention will be described herein below.

Generally, the present inventors have found that a solution to the above mentioned problems of the conventional structure is to utilize existing circuit hardware and maintain the existing circuit layout to minimize breaks in the circuit and to localize the data input/output.

In a basic application, the present invention provides a circuit breaker (and method) that includes a current sensing coil, a voltage reference (e.g., to ground) sensing coil, and an arbitration means to reconcile the signals indicated from the coils (e.g. logical "AND" of coil contacts). For example, current sensed would indicate that the circuit is functioning properly. In a situation where no current is sensed and voltage is sensed, it would be determined that the circuit element is open or that the circuit breaker has tripped. In a situation where no current was sensed and no voltage is sensed, it would be determined that no demand is requested.

Further, the structure of the invention includes an output reporting device, which includes a set of contact closures for integration into a notification system. Additional reporting devices are possible, including (but not limited to) circuit continuity LEDs, audible and/or visual alarms, and analog outputs for current, voltage and/or power values.

As a result, real-time information about the breaker load can be determined and reported (e.g. via auditory an/or visual alarm, etc.) to an operator or an automated system monitor, and can be used to avoid operation of systems in a manner other than indicated as proper.

The present invention is particularly well suited for applications in such industries as furnaces, sputtering tools, evaporators, etc., where heater element or target loss could result in defective product (product loss), or significant quality degradation. Further, the invention lends itself to application in large distributed systems, where troubleshooting is difficult or tedious.

The preferred embodiment has the device packaged as a direct, plug-replaceable, point of use device that can be readily installed or substituted in virtually any existing application (e.g. circuit breaker, circuit protection, diagnostic/analytical system, etc.), with little or no additional consideration.

Figure 1A:
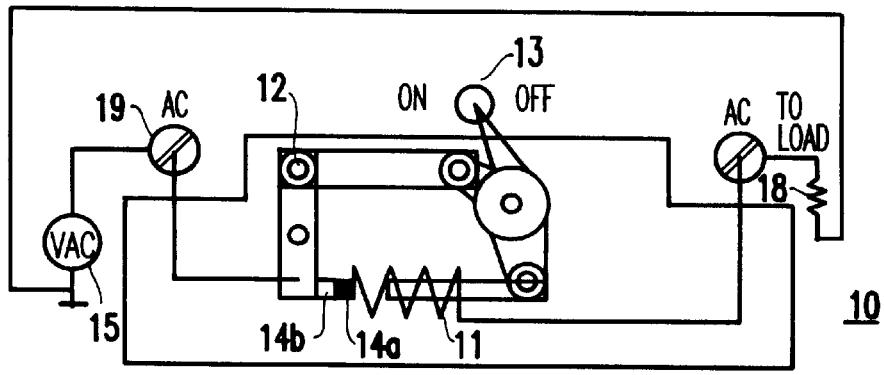
FIG. 1A is a schematic diagram of a conventional circuit breaker 10 for detecting current overload.
Figure 2A:
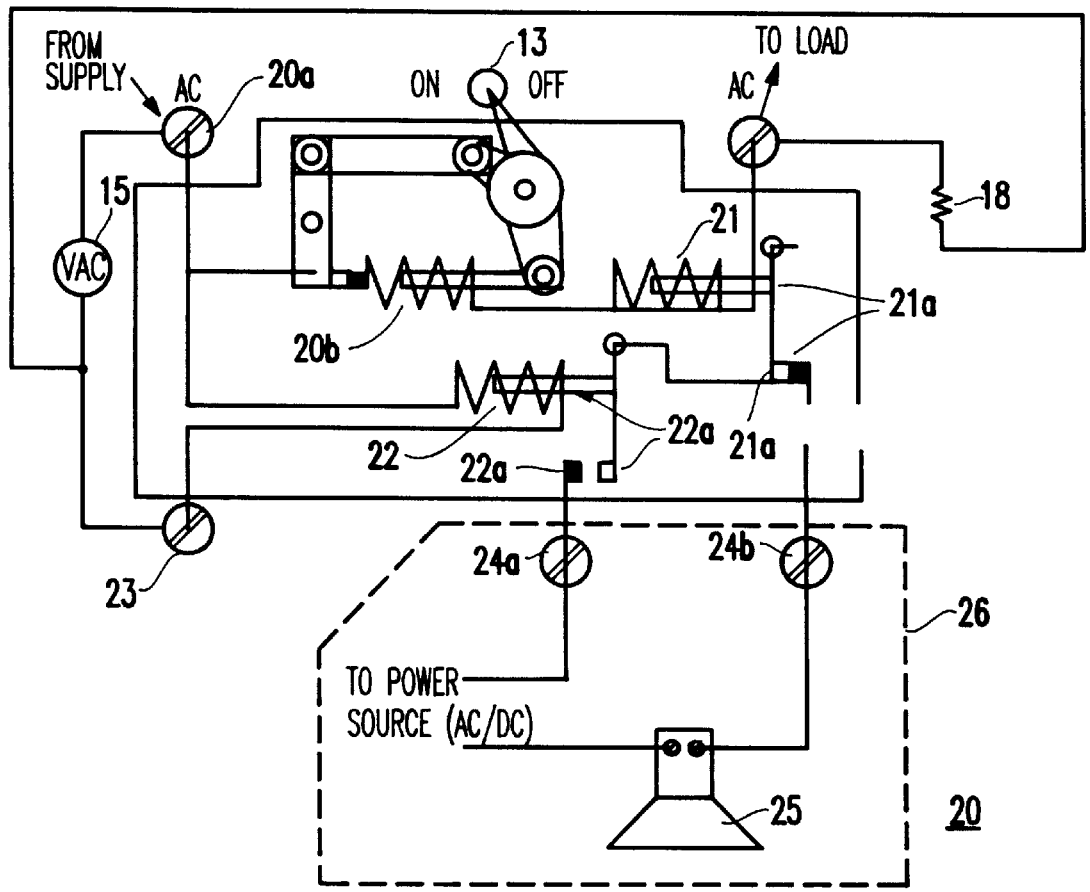
FIG. 2A illustrates a circuit continuity detection system 20, according to the present invention, as incorporated into a circuit breaker.

Turning to the exemplary structure, FIG. 2A shows the circuit continuity detection system (CCDS) 20 of the present invention, which includes current sensing and voltage sensing capability in a single device.

Specifically, a current sensor 21 (e.g. coil), and a voltage sensor 22 (e.g. coil) are provided for respectively sensing current and voltage simultaneously in a single device. In the preferred embodiment of the present invention, standard copper wire coils with solder connections would be used. The current sensor 21 includes contacts 21a which are normally biased closed by a resilient member (e.g. unreferenced spring) or the like, and the voltage sensor 22 similarly includes contacts 22a which are normally biased open by a similar resilient member (e.g. unreferenced spring) or the like. These contacts perform the requisite arbitration to define the load's functionality, and thus are one embodiment of an arbitration means.

Figure 2B:
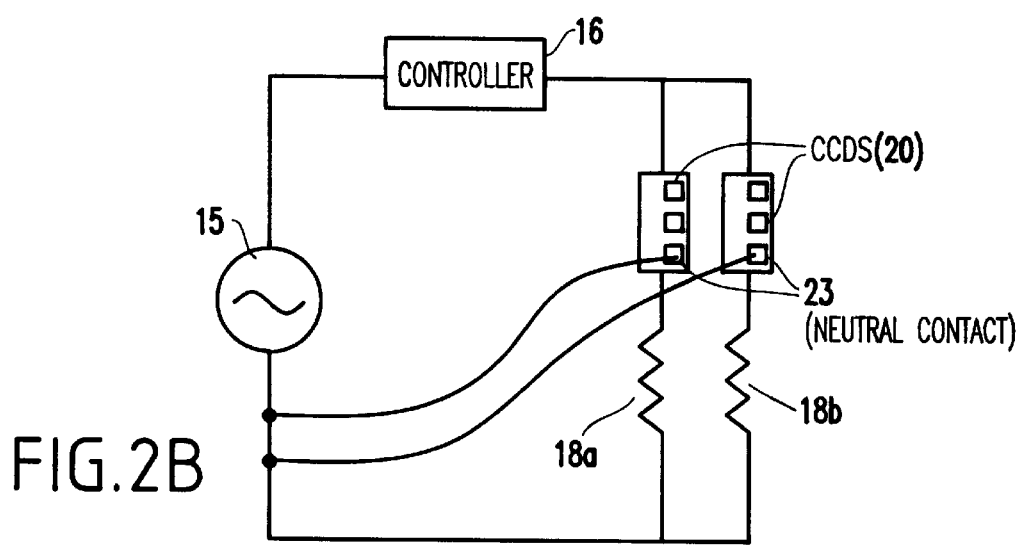
FIG. 2B illustrates an implementation of a circuit continuity detection system, according to the present invention, as incorporated into a circuit breaker (as described in FIG. 2A)

As shown in FIGS. 2A and 2B, the device is connected to a source 15 and a load 18a, 18b, as found in a conventional circuit breaker. An additional neutral contact 23 (defined as a zero voltage reference point for the circuit and its supply voltage) is connected to the voltage sensing coil to provide a reference potential to sense the presence of supply voltage.

A set of output connections 24a, 24b are provided to allow externally powered (e.g., external to the circuit supply voltage) reporting devices 25 to be connected. Examples of these devices might include (but are not limited to) alarm buzzers, strobe/beacon lamps, contact closures, PC inputs, light panels, etc. This external reporting device, along with its requisite external supply, comprises the output circuit 26.

In operation, when no voltage is applied to the load 18, and therefore, no current is flowing through the circuit (and the device of the present invention) (that is, an inactive source condition exists), the current sensing coil 21 remains in its unexcited state, and its associated contacts 21a will remain in their normally closed state. The voltage sensing coil 22 will also remain in its unexcited state, and its associated contacts 22a will remain in their normally open state. Thus, the output circuit 26 will be incomplete, and no continuity disruption condition is reported.

When voltage is applied to the load 18, and therefore, current is flowing through the circuit (and the device of the present invention) (that is, a "normal" operating condition), the current sensing coil 21 will activate, and its associated normally closed contacts 21a will open. The voltage sensing coil 22 will also activate, thereby closing its normally open contacts 22a. Thus, the output circuit 26 will be incomplete, and no continuity disruption condition is reported.

When voltage is applied to the load 18, and no current is flowing through it (and the device of the present invention) (that is, a continuity break exists), the current sensing coil 21 will remain in an unexcited state, and its associated contacts 21a will remain in their normally closed state. The voltage sensing coil 22 will activate, closing its normally open contacts 22a. Thus, the output circuit 26 will be closed, the externally supplied voltage will be connected through the arbitration contacts of the device 21a, 22a to the externally attached reporting device 25, and the continuity disruption condition is reported.

FIG. 2B shows a schematic diagram of an implementation of a circuit continuity detection system, according to the present invention, as incorporated into a circuit breaker (as described in FIG. 2A).

Figure 2C:
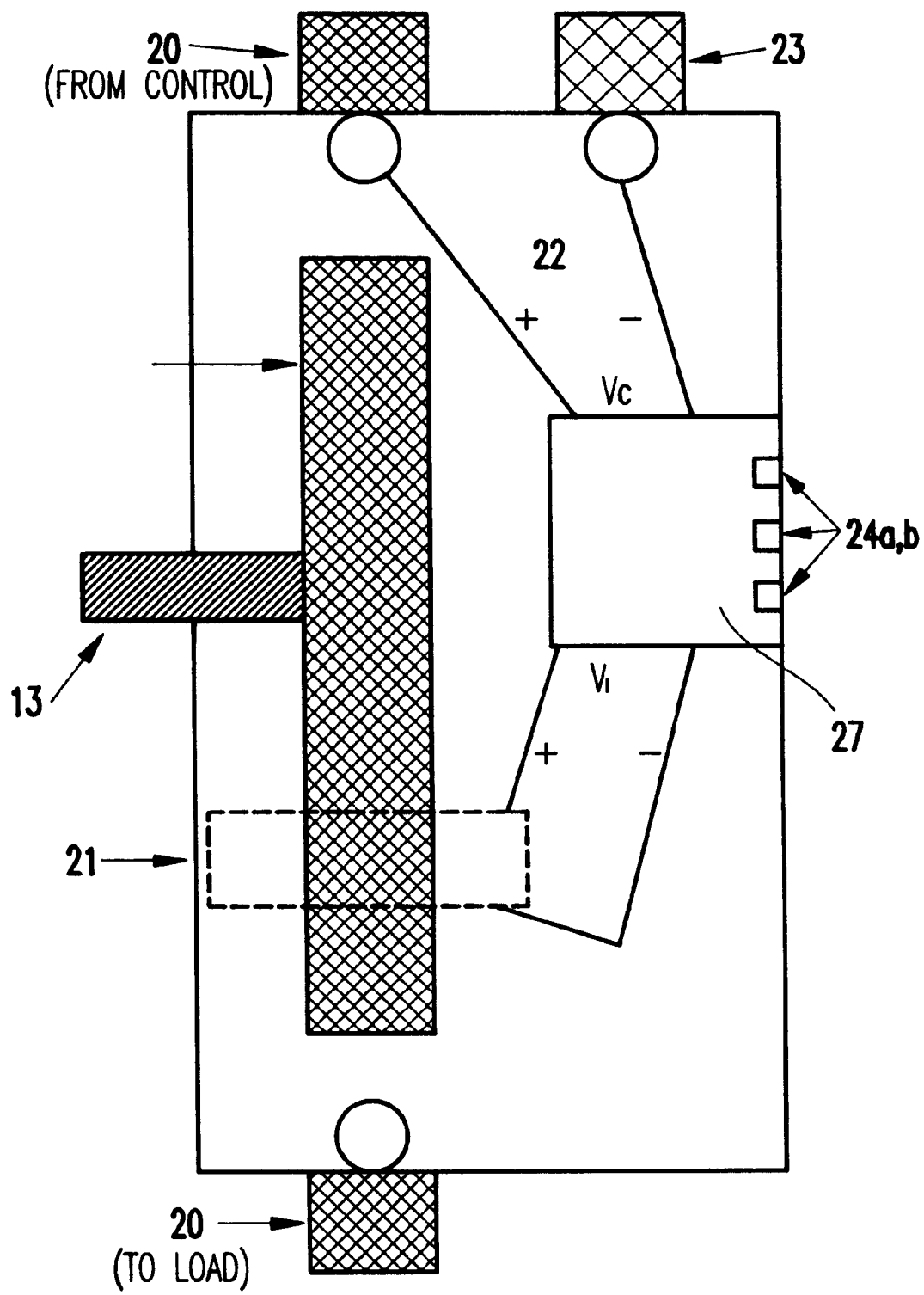
FIG. 2C illustrates a cross-sectional, functional view of a circuit continuity detection system, according to the present invention, as incorporated into a circuit breaker.

FIG. 2C illustrates a cross-sectional, functional view of a circuit continuity detection system, according to the present invention, as incorporated into a circuit breaker. The same reference numerals as FIGS. 2A and 2B are used in FIG. 2C to denote like elements. This diagram illustrates the functional purpose of the device of the present invention. A sense of incoming voltage is made (e.g., at 22), as is a sense of current flow (e.g., at 21). The signals from these sensors are routed to an arbitration device 27, which uses them to determine the characteristics of the load of the circuit. The connection to the reporting device 24 is indicated to allow for the reporting of the continuity disruption condition. This diagram is used to represent the function of the present invention in its broadest terms, without providing limitation to its implementation.

Figure 1B:
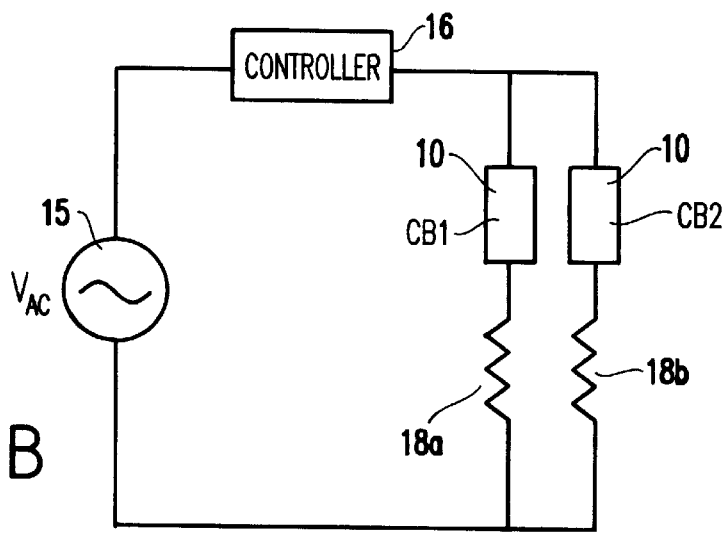
FIG. 1B is a schematic diagram showing a standard implementation of a conventional circuit breaker 10 as detailed in FIG. 1A.
Figure 3:
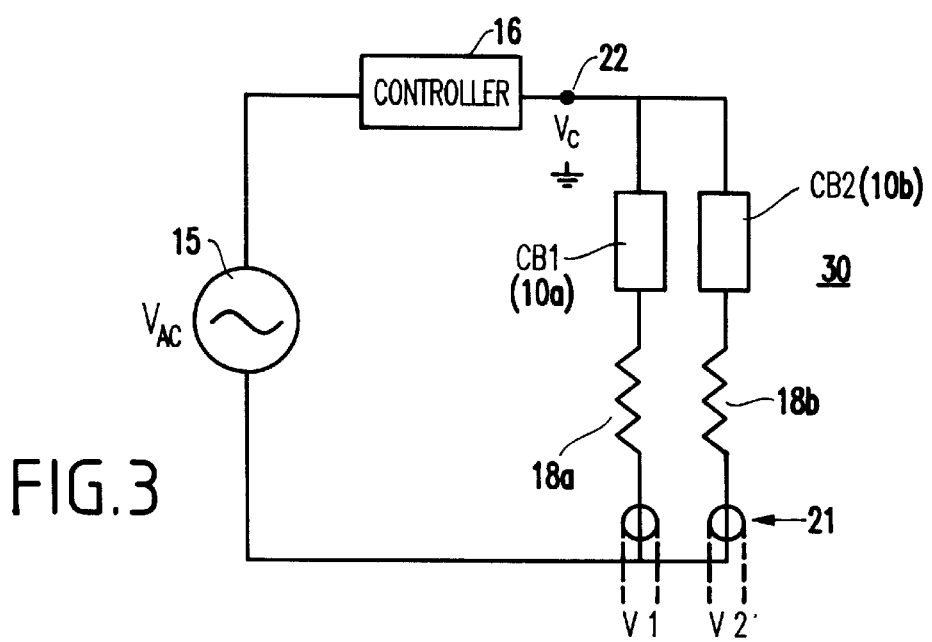
FIG. 3 illustrates a piecemeal method to detect element continuity according to the present invention, utilizing means that do not account for the packaging of the detection system in a discrete device.

FIG. 3 illustrates a piecemeal method to detect element continuity according to the present invention, utilizing means that do not account for the packaging of the detection system in a discrete device. Using the structure of FIG. 1B, which is a standard implementation of a circuit breaker 10*a*, 10*b*, a discrete voltage sensor 22 is applied downstream of the circuit controller to determine the presence of supply voltage VC.

Individual, discrete current sensing loops 21 are installed near each parallel element of the circuit load 18*a*, 18*b* to determine the presence of current flow $VI_1$, $VI_2$. In such an implementation, an external arbitration of these signals (via relays, amplifiers, processors, logic gates, etc.) would be needed to determine the requisite alarm condition VC+ ($VI_1'+VI_2'$). As shown, the voltage sensor and current sensors are separate components, as opposed to a discrete device as demonstrated by the teachings of the present invention.

With the unique and unobvious features of the present invention, an open load condition can be detected via the detection of simultaneous load current and applied voltage.

Further, the structure of the invention can be implemented as a discrete device in a host of applications, and need not be implemented necessarily as part of a circuit breaker. That is, the device is a single point current and voltage sensing device, such that no coil need be placed near a wire and no voltage sensor need be placed near a power supply or controller.

As described, the device is implementable with minimal installation considerations, consumes no meaningful or costly space, and can be constructed easily, using off the shelf components. It is inexpensive to build and install, and its logic makes it a reliable means of performing the function prescribed.

While the invention has been described in terms of preferred embodiments, those skilled in the art will recognize that the invention can be practiced with modification within the spirit and scope of the appended claims.

An ideal application of the invention is industrial heating and semiconductor manufacturing equipment. However, numerous other applications such as in (but not limited to) motors, pumps, medical devices, aerospace, automotive and household electronics, household appliances, etc. are logical extensions of the inventive structure and process described hereinabove.

Further, while several status reporting means have been discussed herein, others are possible, such as (but not limited to) status LEDs, contact closures (for point I/O wiring interface or alarm indicators), audible or visual alarms, PLC input, voltage, current and/or power metrology (analog or digital), etc.

What is claimed is:

1. A circuit continuity detection system coupled to a voltage source and a load, comprising:
    a current sensor for sensing a current drawn through an electrical circuit of a resistive nature;
    a voltage sensor for sensing a voltage applied from said source across said load, simultaneously with sensing of said current by said current sensor; and
    an arbitration device for arbitrating outputs from said current sensor and said voltage sensor to determine an operable status of said load,
    wherein said voltage sensor comprises a passive device for indicating a presence of a line voltage without a corresponding current and without external power being supplied thereto, as an indication of a fault condition, said circuit continuity detection system being a point-of-use, self-contained, plug-replaceable state response device devoid of external logic and voltage-specific wiring.

2. The system according to claim 1, further comprising:
    a circuit zero voltage reference coupled to said voltage sensor; and
    a neutral contact connected to said circuit zero voltage reference.

3. The system according to claim 1, further comprising:
    a set of output contacts allowing for connection to an external power source; and
    an external reporting device coupled to said output contacts.

4. The system according to claim 3, wherein said reporting device comprises at least one of an alarm buzzer, a beacon light, a contact closure, a programmable logic controller, a relay, and a personal computer.

5. The system according to claim 3, further comprising an output circuit coupled to said reporting device.

6. The system according to claim 1, wherein said current sensor comprises a current sensing coil, and said voltage sensor comprises a voltage sensing coil.

7. The system according to claim 5, wherein said voltage sensor includes voltage sensor contacts which are normally biased open, and said current sensor includes current sensor contacts which are normally biased closed.

8. The system according to claim 7, wherein, when no voltage is applied to the system and no current is flowing through the system, the current sensor remains in an unexcited state, and said current sensor contacts remain in their normally closed state, and the voltage sensor remains in an unexcited state and said voltage sensor contacts remain in their normally open state, such that no closure of the output circuit is made, and such that no continuity disruption condition is reported.

9. A circuit continuity detection system coupled to a voltage source and a load, comprising:
    a current sensor for sensing a current drawn through an electrical circuit of a resistive nature;
    a voltage sensor for sensing a voltage applied from said source across said load, simultaneously with sensing of said current by said current sensor;
    an arbitration device for arbitrating outputs from said current sensor and said voltage sensor to determine an operable status of said load;
    a set of output contacts allowing for connection to an external power source;
    an external reporting device coupled to said output contacts; and
    an output circuit coupled to said reporting device,
    wherein said voltage sensor comprises a passive device for indicating a presence of a line voltage without a corresponding current and without external power being supplied thereto, as an indication of a fault condition in the electrical circuit element of a resistive nature, said circuit continuity detection system being a point-of-use, self-contained, plug-replaceable state response device devoid of external logic and voltage-specific wiring,
    wherein said voltage sensor includes voltage sensor contacts which are normally biased open, and said current sensor includes current sensor contacts which are normally biased closed, and wherein when voltage is applied to said system and current is flowing through said system, the current sensor activates, opening said normally closed current sensor contacts, and said voltage sensor activates, thereby closing said normally open voltage sensor contacts, such that no closure of the output circuit is made, and such that no continuity disruption condition is reported.

10. A circuit continuity detection system coupled to a voltage source and a load, comprising:

a current sensor for sensing a current drawn through an electrical circuit of a resistive nature;

a voltage sensor for sensing a voltage applied from said source across said load, simultaneously with sensing of said current by said current sensor;

an arbitration device for arbitrating outputs from said current sensor and said voltage sensor to determine an operable status of said load;

a set of output contacts allowing for connection to an external power source;

an external reporting device coupled to said output contacts; and an output circuit coupled to said reporting device, wherein said voltage sensor comprises a passive device for indicating a presence of a line voltage without a corresponding current and without external power being supplied thereto, as an indication of a fault condition in the electrical circuit of a resistive nature, said circuit continuity detection system being a point-of-use, self-contained. plug-replaceable state response device devoid of external logic and voltage-specific wiring, wherein said voltage sensor includes voltage sensor contacts which are normally biased open, and said current sensor includes current sensor contacts which are normally biased closed, and wherein when voltage is applied to the system and no current is flowing through said system, the current sensor remains in an unexcited state, and said current sensor contacts remain in their normally closed state, and said voltage sensor activates, closing said normally open voltage sensor contacts, such that the output circuit is closed, and the externally applied source voltage is connected to the reporting device, and such that the continuity disruption condition is reported.

11. A circuit breaker coupled between a voltage source and a load, comprising:

a continuity detection system coupled to said voltage source and said load, said continuity detection system including:

a current sensor for sensing a current through an electrical circuit of a resistive nature;

a voltage sensor for sensing a voltage from said source across said load simultaneously with sensing of said current by said current sensor; and an arbitration device for arbitrating outputs from said current sensor and said voltage sensor to determine an operable status of said load, wherein said voltage sensor comprises a passive device for indicating a presence of a line voltage without a corresponding current and without external power being supplied thereto, as an indication of a fault condition in the electrical circuit of a resistive nature, said circuit continuity detection system being a point-of-use, self-contained, plug-replaceable state response device devoid of external logic and voltage-specific wiring.

12. The circuit breaker according to claim 11, said continuity detection system further comprising:

a circuit zero voltage reference coupled to said voltage sensor; and a neutral contact connected to said circuit zero voltage reference.

13. The circuit breaker according to claim 11, said continuity detection system, further comprising:

a set of output contacts allowing for connection to an external power source; and an external reporting device coupled to said output contacts.

14. The circuit breaker according to claim 13, wherein said reporting device comprises at least one of an alarm buzzer, a beacon light, a contact closure, a programmable logic controller, a relay, and a personal computer.

15. The circuit breaker according to claim 13, said continuity detection system further comprises an output circuit coupled to said reporting device.

16. The circuit breaker according to claim 11, wherein said current sensor comprises a current sensing coil, and said voltage sensor comprises a voltage sensing coil.

17. The circuit breaker according to claim 15, wherein said voltage sensor includes voltage sensor contacts which are normally biased open, and said current sensor includes current sensor contacts which are normally biased closed.

18. The circuit breaker according to claim 17, wherein, when no voltage is applied to the system and no current is flowing through the system, the current sensor remains in an unexcited state, and said current sensor contacts remain in their normally closed state, and the voltage sensor remains in an unexcited state and said voltage sensor contacts remain in their normally open state, such that no closure of the output circuit is made, and such that no continuity disruption condition is reported.

19. A circuit breaker coupled between a voltage source and a load, comprising:

a continuity detection system coupled to said voltage source and said load, said continuity detection system including:

a current sensor for sensing a current through an electrical circuit of a resistive nature;

a voltage sensor for sensing a voltage from said source across said load simultaneously with sensing of said current by said current sensor; and an arbitration device for arbitrating outputs from said current sensor and said voltage sensor to determine an operable status of said load;

a set of output contacts allowing for connection to an external power source;

an external reporting device coupled to laid output contacts; and an output circuit coupled to said reporting device, wherein said voltage sensor includes voltage sensor contacts which are normally biased open, and said current sensor includes current sensor contacts which are normally biased closed, wherein said voltage sensor comprises a passive device for indicating a presence of a line voltage without a corresponding current and without external power being supplied thereto, as an indication of a fault condition in an electrical circuit of a resistive nature, said circuit continuity detection system being a point-of-use, self-contained, plug-replaceable state response device devoid of external logic and voltage-specific wiring, and wherein when voltage is applied to said system and current is flowing through said system, the current sensor activates, opening said normally closed current sensor contacts, and said voltage sensor activates, thereby closing said normally open voltage sensor contacts, such that no closure of the output circuit is made, and such that no continuity disruption condition is reported.

20. A circuit breaker coupled between a voltage source and a load, comprising:

a continuity detection system coupled to said voltage source and said load, said continuity detection system including:

a current sensor for sensing a current through an electrical circuit of a resistive nature;

a voltage sensor for sensing a voltage from said source across said load simultaneously with sensing of said current by said current sensor;

an arbitration device for arbitrating outputs from said current sensor and said voltage sensor to determine an operable status of said load;

a set of output contacts allowing for connection to an external power source;

an external reporting device coupled to laid output contacts; and an output circuit coupled to said reporting device, wherein said voltage sensor includes voltage sensor contacts which are normally biased open, and said current sensor includes current sensor contacts which are normally biased closed, wherein said voltage sensor comprises a passive device for indicating a presence of a line voltage without a corresponding current and without external power being supplied thereto, as an indication of a fault condition in the electrical circuit of a resistive nature, said circuit continuity detection system being a point-of-use self-contained, plug-replaceable state response device devoid of external logic and voltage-specific wiring, and wherein when voltage is applied to the system and no current is flowing through said system, the current sensor remains in an unexcited state, and said current sensor contacts remain in their normally closed state, and said voltage sensor activates, closing said normally open voltage sensor contacts, such that the output circuit is closed, and the externally applied source voltage is connected to the reporting device, and such that the continuity disruption condition is reported.

21. A method of detecting continuity of a circuit coupled to a voltage source and a load, said method comprising:

sensing a current drawn through an electrical circuit of a resistive nature to produce a first output;

sensing a voltage applied from said source across said load, simultaneously with sensing of said current, to produce a second output; and arbitrating said first and second outputs to determine an operable status of said load, wherein said sensing a voltage is performed by a passive device for indicating a presence of a line voltage without a corresponding current and without external power being supplied thereto, as an indication of a fault condition in the electrical circuit of a resistive nature, said circuit continuity detection system being a point-of-use, self-contained, plug-replaceable state response device devoid of external logic and voltage-specific wiring.

* * * * *